United States Patent [19]

Ho et al.

[11] Patent Number: 5,656,535
[45] Date of Patent: Aug. 12, 1997

[54] STORAGE NODE PROCESS FOR DEEP TRENCH-BASED DRAM

[75] Inventors: Herbert Ho, Washingtonville; Radhika Srinivasan, Wappingers Falls; Scott D. Halle, Hopewell Junction; Erwin Hammerl, Stormville; David M. Dobuzinsky, Hopewell Junction; Jack A. Mandelman, Stormville; Mark Anthony Jaso, Yorktown Heights, all of N.Y.

[73] Assignees: Siemens Aktiengesellschaft, Munich, Germany; International Business Machines Corporation, Armonk, N.Y.

[21] Appl. No.: 610,912

[22] Filed: Mar. 4, 1996

[51] Int. Cl.[6] .................................. H01L 21/70
[52] U.S. Cl. ............................... 438/386; 438/696
[58] Field of Search ........................ 437/47, 52, 60, 437/919, 48, 203, 51; 148/DIG. 14

[56] References Cited

U.S. PATENT DOCUMENTS

| | | | |
|---|---|---|---|
| 5,096,849 | 3/1992 | Beilstein, Jr. et al. | 148/DIG. 106 |
| 5,360,758 | 11/1994 | Bronner et al. | 437/60 |
| 5,395,786 | 3/1995 | Hsu et al. | 437/919 |
| 5,422,294 | 6/1995 | Noble, Jr. | 437/60 |
| 5,525,531 | 6/1996 | Bronner et al. | 437/919 |

Primary Examiner—Tuan H. Nguyen
Attorney, Agent, or Firm—Donald B. Paschburg

[57] ABSTRACT

A simplified method of fabricating a storage node for a deep trench-based DRAM on a semiconductor substrate. The method involves the etching a trench in a surface of the substrate and then forming a layer of dielectric material on a sidewall of the trench the top portion of which is subsequently removed from the sidewall. Next, a layer of oxide is grown on the exposed portion of the sidewall. A portion of this layer of oxide is then removed from the sidewall in order to orient the layer of oxide a predetermined distance from the surface of the substrate. Finally, the trench is filled with a semiconductive material.

20 Claims, 5 Drawing Sheets

FIG. 10
FIG. 11
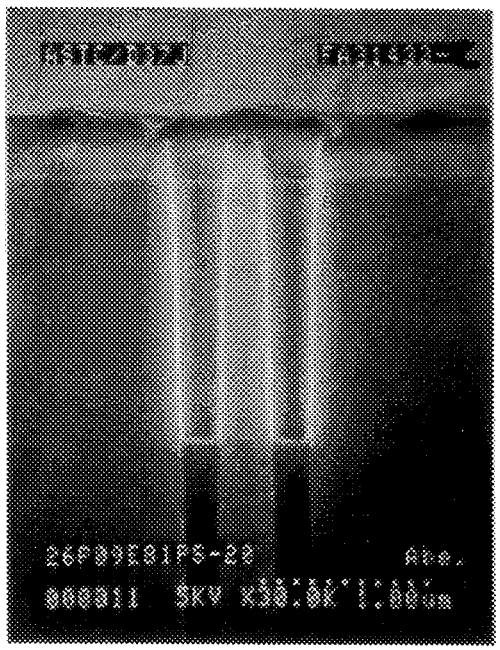
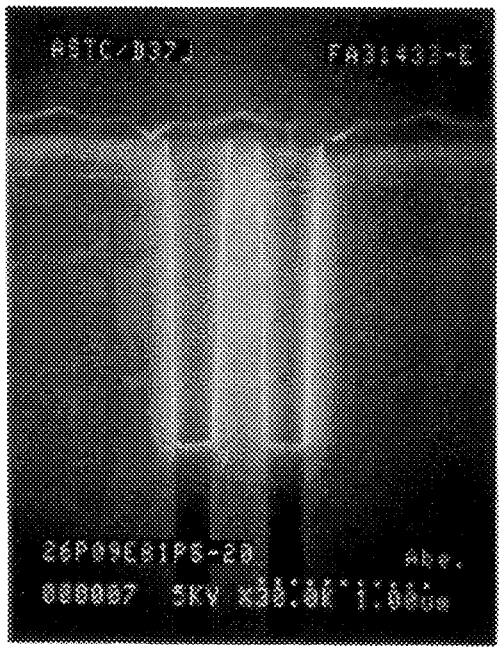

STORAGE NODE PROCESS FOR DEEP TRENCH-BASED DRAM

BACKGROUND OF THE INVENTION

1. Field of the Invention

The present invention relates generally to dynamic random access memories (DRAMS), and more particularly to a method for forming a storage node which utilizes a reduced number of polyfills and chemical-mechanical polishes that provides a smooth transition between the node dielectric and the collar oxide of the storage node.

2. Description of the Prior Art

Deep trench-based storage devices are commonly used in DRAM cells. Such devices are typically etched 4–8 um deep into the silicon substrate. The process used for forming the deep trench differs between 4 Mb, 16 Mb, 64 Mb, 256 Mb, and 1 GB DRAM cells, however, there are a given number of process steps that are common to each generation of DRAM cell. The commonly performed deep trench processing steps, which constitute a large portion of the cost of making each of these trench-based DRAM cells, are as follows: the deposition of a node dielectric by low pressure chemical vapor deposition (LPCVD) of SiN, the reoxidation of the node dielectric, the deposition of a first polysilicon fill rising LPCVD, the chemical mechanical polish of the first polysilicon fill, the etching of a first recess in the first polysilicon fill using reactive ion etching (RIE), the deposition of a collar oxide, the etching of the collar oxide using RIE, the deposition of a second polysilicon fill using LPCVD, and the chemical mechanical polish the second polysilicon fill.

In the 256 Mb DRAM deep trench process, the connection between the storage trench and its associated array transistor is provided by a third polysilicon fill that is etched 50 nm below the silicon surface. This processing step is commonly referred to as the "buried strap formation". The buried strap process complicates the deep trench process and makes the deep trench process significantly more costly.

Another problem associated with the 256 Mb DRAM cell process relates to the vulnerability of the top portion of the SiN node dielectric. In current deep trench processing, the node dielectric is etched off the sidewalls of the trench. The depth of the node dielectric etch is determined by the first deep trench recess formed in the first polysilicon fill. The top portion of the node dielectric is susceptible to damage by the deep trench recess, the node dielectric etch, and collar oxide etch processes. The node dielectric thickness presently used is 6 nm, however, the final targeted thickness is even thinner or approximately 5 nm. In large deep trench test macros (224 Mb deep trenches), it has been found that shorting between the deep trenches is more prevalent when the first deep trench recess and, the node and collar oxide etch process are used. Conversely, when these processes are not used, the frequency of shorting between the deep trenches is negligible.

The shorting that occurs between the trenches originates at exposed areas of the deep trench sidewall which are at the top of the node dielectric. An exposed portion of the deep trench sidewall will eventually leave the substrate in contact with the polysilicon fill thus, causing shorts. As the node dielectric is further scaled down to 5 nm, these "extrinsic" fails will become even more ubiquitous.

It is, therefore, an object of the present invention to provide a simplified method for forming a storage node in a deep trench process which reduces the number of polysilicon fills and chemical-mechanical polishes and also provides a smooth transition between the node dielectric and the collar oxide.

SUMMARY OF THE INVENTION

The present invention is a simplified method of fabricating a storage node for a deep trench-based DRAM on a semiconductor substrate. The method comprises the etching a trench in a surface of the substrate and then forming a layer of dielectric material on a sidewall of the trench. Next, a layer of oxide is grown on the sidewall. A portion of the layer of oxide is then removed from the sidewall in order to orient the layer of oxide a predetermined distance from the surface of the substrate. Finally, the trench is filled with a semiconductive material.

BRIEF DESCRIPTION OF THE DRAWINGS

For a detailed understanding of the present invention, reference should be made to the following detailed description taken in conjunction with the accompanying drawings wherein:

FIGS. 10 and 11 are SEM micrographs after etching the resist down to a previously defined buried plate;

DETAILED DESCRIPTION OF THE INVENTION

The present invention describes a method which simplifies the storage node formation portion of the deep trench process by reducing the number of polysilicon fills and chemical-mechanical polishes from three to one and which also provides a smooth transition between the node dielectric and the collar oxide. This is accomplished in the present method by employing a resist fill and a chemical downsteam etching (CDE) technique to etch the node dielectric off the top portion of each of the deep trenches, and a self-defined, thermally-grown collar oxide that is formed during the node reoxidation of the SiN node dielectric.

Although the method of the present invention will be described in regard to fabricating a 256 Mb DRAM cell, it should be understood that the present method is equally useful for fabricating other generation DRAM cells such as 4, 16 and 64 Mb DRAMs.

Figure 1:
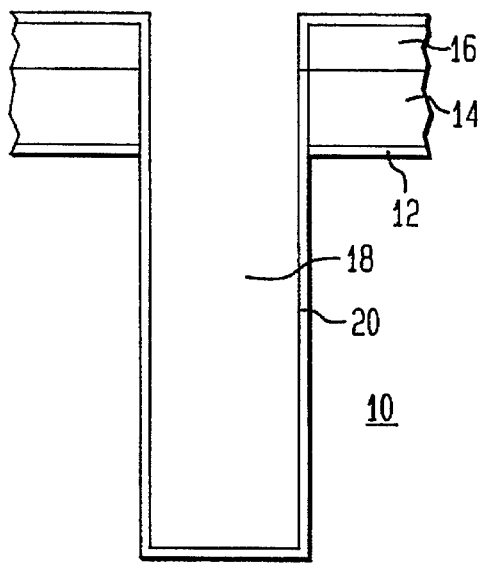
FIG. 1 is a cross-sectional view through a deep trench DRAM after the deposition of a SiN node dielectric.

Referring to FIG. 1, a cross-sectional view through one of the deep trenches 18 etched in a silicon substrate 10 is shown. The method of the present invention is implemented after a first resist fill for buried plate formation (not shown) and node dielectric 20 of SiN has been deposited in the deep trench 18 using conventional LPCVD techniques. The deep trench 18 is formed using conventional RIE techniques. Further, a pad oxide layer 12, a SiN pad layer 14, and a deep trench mask layer 16 of TEOS have been deposited on the surface of the substrate 10.

Figure 2:
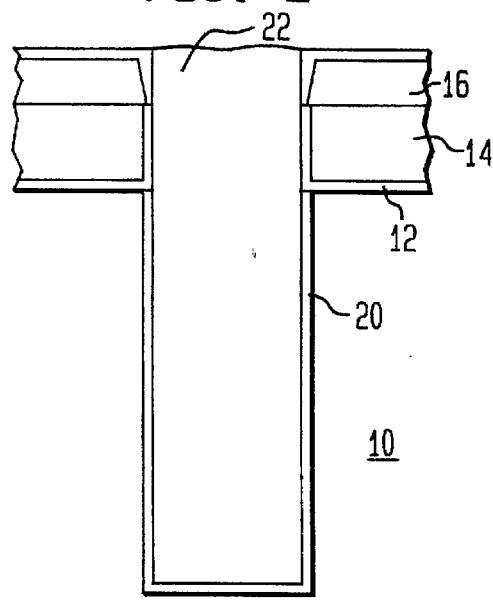
FIG. 2 is a cross-sectional view through the deep trench DRAM of FIG. 1 after filling the trench with resist.
Figure 3:
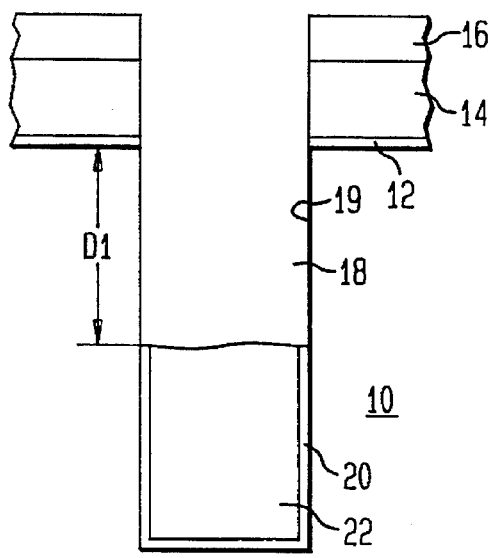
FIG. 3 is a cross-sectional view through the deep trench DRAM of FIG. 2 after recess etching the resist.

After the node dielectric 20 has been deposited, a second resist fill 22 of for example, AZ 7500, is deposited (without baking) in the deep trench 18 as shown in FIG. 2. Next, in FIG. 3, a second CDE is used to etch the resist fill 22 to a depth D1 of approximately 1.5 um, this being the depth of a previously defined arsenosilicate glass (ASG)/buried plate (not shown). As can be seen, the node dielectric 20 has been removed entirely from the upper portion of the deep trench sidewall 19. During the CDE process, additional silicon on the order of approximately 10 nm can be removed from the upper portion of the deep trench sidewall 19 in order enlarge the deep trench 18 to account for the later growing of an oxide at the upper portion of the deep trench sidewall 19 which could hinder the proper filling of the deep trench 18 with polysilicon.

Figure 4:
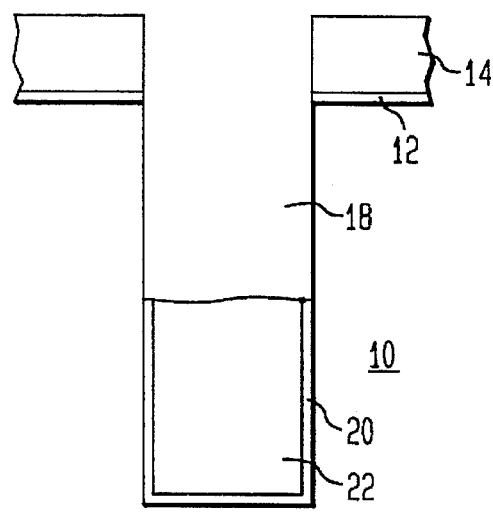
FIG. 4 is a cross-sectional view through the deep trench DRAM of FIG. 3 after stripping the TEOS mask and a resist clean of the deep trench.

In FIG. 4, the entire deep trench mask layer 16 of TEOS that was used for forming the deep trench 18 has been stripped away using a 7:1 BHF etch for 520 s. As shown, the etching is performed without undercutting the pad films 14 and 12.

Figure 5:
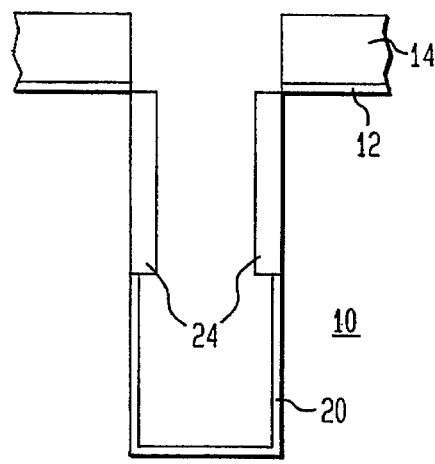
FIG. 5 is a cross-sectional view through the deep trench DRAM of FIG. 4 after a collar/node reoxidation.

After striping the deep trench mask layer 16 and performing a resist clean of the deep trench 18 to remove the resist fill 22, a node reoxidation process is performed. As shown in FIG. 5, the node reoxidation process oxidizes the node dielectric 20 remaining in the deep trench 18 and grows a collar oxide 24. The node reoxidation process uses a thermal wet oxidation performed at approximately 900° C. at 10 m wet $O_2$, to grow the collar oxide 24 along the deep trench sidewall 19 to a thickness of approximately 50 nm.

Figure 6:
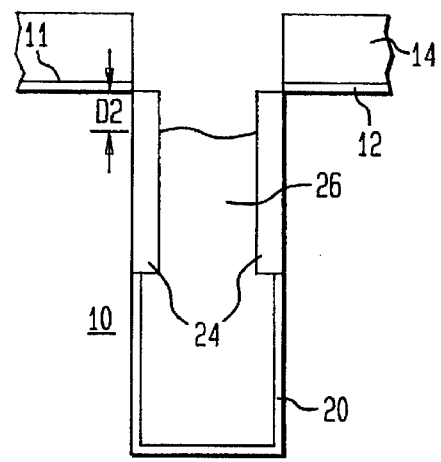
FIG. 6 is a cross-sectional view through the deep trench DRAM of FIG. 5 after filling the trench with resist.

In FIG. 6, the deep trench 18 has been filled once again with a third resist fill 26 and subsequently recessed using a CDE process down to a depth D2 of between 100 and 150 nm below the surface 11 of the silicon substrate 10.

Figure 7:
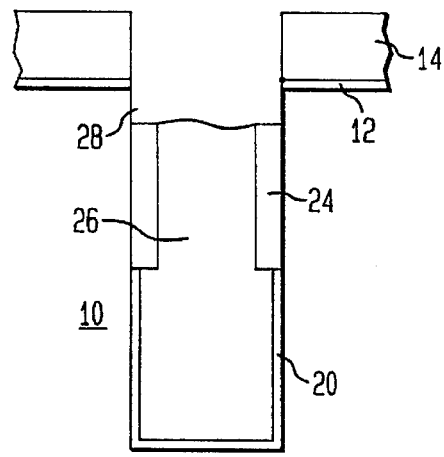
FIG. 7 is a cross-sectional view through the deep trench DRAM of FIG. 6 after a collar oxide etch.

In FIG. 7, a short duration wet etch using a 40:1 BHF (approximately 3–4 minutes) or alternatively a 7:1 BHF (approximately 30–40 seconds), has been used to remove the collar oxide 24 off the deep trench sidewall 19. The wet etch is used to form the lower portion of a buried strap 28. After wet etching the resist fill 26 is cleaned from the deep trench 18.

Figure 8:
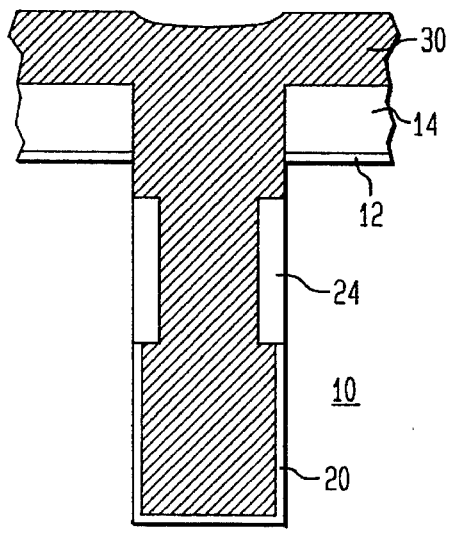
FIG. 8 is a cross-sectional view through the deep trench DRAM of FIG. 7 after filling the trench with polysilicon.
Figure 9:
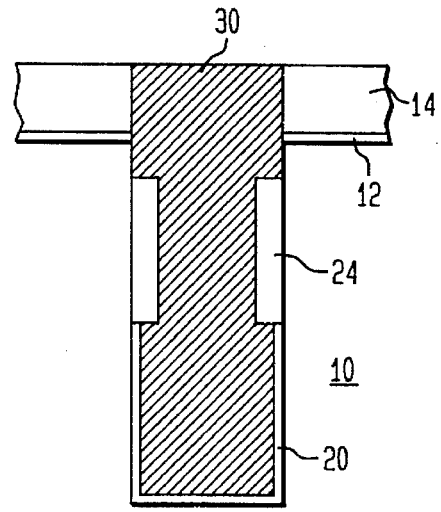
FIG. 9 is a cross-sectional view through the deep trench DRAM of FIG. 8 after planarization.

In FIG. 8, the deep trench 18 has been filled with an arsenic-doped polysilicon 30 which covers the pad SiN 14. The polysilicon fill 30 is subsequently planarized down to the pad SiN 14 using a chemical-mechanical polish as shown in FIG. 9. The polysilicon fill and planarization steps described above are performed only once in the method of the present invention as compared to the 3 polysilicon fills and chemical-mechanical polishes of prior art techniques. After the planarization of the polysilicon fill 30, a buried strap recess process is performed along with the remaining process steps for a 256 Mb DRAM.

Figure 12:
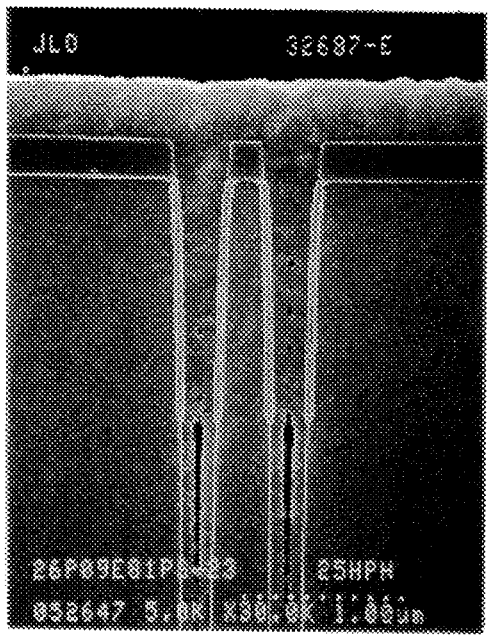
FIGS. 12 and 13 are SEM micrographs of deep trenches that have been processed according to the present invention.
Figure 13:
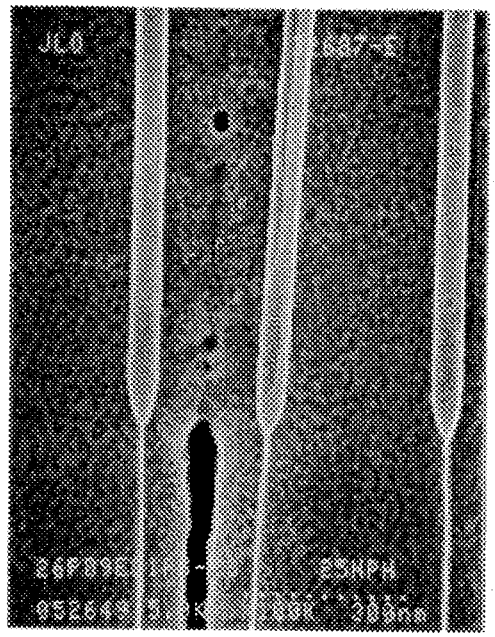

The resulting structure created by the method of the present invention can be seen in the SEM micrographs of FIGS. 10 and 11 which show a 256 Mb DRAM made in accordance with the present invention after a second CDE recess (i.e. an etch of the resist down to the buried plate depth). As can be seen, there is excellent uniformity between the center and edge chips. FIGS. 12 and 13 are SEM micrographs of deep trenches that have proceeded through the following processing steps: 1) CDE to form the second recess, 2) 7:1–520 s BHF etch (mask TEOS strip), 3) resist clean, 4) node reoxidation (900° C.–10 m wet), and 5) intrinsic polyfill. The micrographs of FIGS. 12 and 13 show an oxide, approximately 50 nm thick, along the deep trench sidewall. In addition, at the bottom of the collar oxide, there is a small "bird-beak" shaped structure present at the node/collar intersection. The "bird-beak" shaped structure is important as it provides a smooth transition between the reoxidized node dielectric and the collar oxide. Thus, the probability of deep trench-substrate shorts are greatly reduced. Note that the voids which can be observed in the polysilicon fill underneath the collar oxide (~60 nm in diameter), can be minimized by slightly recessing the deep trench sidewalls as described earlier, by using the CDE after the resist/node dielectric etch, to etch off the top portion of the deep trench.

Figure 14:
FIG. 14 is a cross-sectional TEM micrograph showing an undercut region associated with the pad oxide of a deep trench DRAM made in accordance with the present invention.

A TEOS mask strip of approximately 9 minutes long can be implemented after performing the second CDE due to the presence of the SiN node dielectric present within the undercut region of the pad oxide. This undercut region is formed during the removal of the ASG which forms the buried plate. The undercut region can vary in length from the cross-section TEMs of the pad oxide undercut, thus, the undercut region has been observed to vary as much as 70 nm. However, immediately after the ASG strip, the node dielectric is deposited and "plugs" up the undercut region entirely. FIG. 14 is a cross-section TEM micrograph which shows a 70 nm undercut region that is, for the most part, filled entirely with the node dielectric. The presence of this node dielectric protects the pad oxide from being fully undercut and allows for further oxide etches, namely the mask TEOS etch and the collar oxide etch to define the bottom of the buried strap.

The primary benefits of the method of the present invention are lower cost and reduced process time. In particular a cost savings of approximately 11% and a process time savings achieved through an approximately 49% reduction in the number of processing steps, are realized over the present DT processing methods.

Apart from the cost savings, the method of the present invention does not require any unique tools or tool development. Moreover, in addition to the benefits stemming from the reduction of DT polyfills from three to one as previously described, the elimination of the first and second polysilicon fills substantially avoids the possibility of oxide residuals from either incomplete collar etching, or interfacial oxide buildup of the first As-doped polysilicon fill (e.g. formed during the waiting period between the first and second polysilicon fills). The corresponding reduction from three DT poly CMPs to one DT poly CMP substantial overcomes or reduces the problem of pad SiN erosion due to the multiple CMPs. Further, the presence of a thermally-grown oxide for the collar oxide avoids the diffusion of oxygen into the collar oxide and generally reduces the formation of the vertical bird's beak of the collar oxide. This, in turn, should reduce the tendency of trench-induced dislocations from forming in the array. Still further DT-substrate shorts are generally eliminated since the present invention produces a smooth transition from the thermally grown collar oxide to the node dielectric. Finally, the metals that are typically present in reactive ion etching (RIE) during polyfill recess processes which could adversely affect the storage capacity of the DT are substantially eliminated.

It should be understood that the embodiments described herein are merely exemplary and that a person skilled in the art may make many variations and modifications to these embodiments utilizing functionally equivalent elements to those described herein. Any and all such variations or modifications as well as others which may become apparent to those skilled in the art, are intended to be included within the scope of the invention as defined by the appended claims.

What is claimed is:

1. A method of fabricating a storage node for a deep trench-based DRAM on a semiconductor substrate, comprising the steps of:

etching a trench in a surface of said substrate;

forming a layer of dielectric material on a sidewall of said trench;

partially removing said layer of dielectric material in order to expose an underlying region of an upper portion of said sidewall;

growing a layer of oxide on said upper portion of said sidewall;

removing a portion of said layer of oxide from said sidewall in order to orient said layer of oxide a predetermined distance from said surface of said substrate; and filling said trench with a semiconductive material.

2. The method according to claim 1, wherein said step of forming a layer of dielectric material includes low pressure chemical vapor deposition.

3. The method according to claim 2, wherein said layer of dielectric material comprises silicon nitride.

4. The method according to claim 1, wherein said step of partially removing said layer of dielectric material includes the steps of:

filling said trench with a resist material; and etching said resist a predetermined depth thereby partially removing said layer of dielectric material and exposing said underlying region of said upper portion of said sidewall.

5. The method according to claim 1, wherein said step of growing a layer of oxide includes the step of oxidizing both said layer of dielectric material remaining on said sidewall and said exposed region of said sidewall.

6. The method according to claim 5, wherein said layer of oxide includes a collar-shaped oxide layer formed on said exposed region of said sidewall.

7. The method according to claim 6, wherein said collar-shaped oxide layer is approximately 50 nm in thickness.

8. The method according to claim 1, wherein said step of removing a portion of said layer of oxide includes the steps of:

filling said trench with a resist material; and etching said resist a predetermined depth thereby removing said portion of said layer of oxide from said sidewall.

9. The method according to claim 8 wherein said step of etching said resist etches said underlying region of said sidewall exposed by said partial removal said layer of dielectric material.

10. The method according to claim 1, further comprising the step of planarizing said substrate after said step of filling.

11. The method according to claim 1, wherein said substrate is silicon.

12. The method according to claim 1, wherein said semiconductive material is polysilicon.

13. The method according to claim 12, wherein said polysilicon is doped with arsenic.

14. A method of fabricating a storage node for a deep trench-based DRAM on a silicon substrate, comprising the steps of:

etching a trench in a surface of said substrate;

depositing a node dielectric on a sidewall of said trench;

growing an oxide collar on said sidewall;

filling said trench with a resist material;

etching said resist a predetermined depth thereby removing a portion of said oxide collar from said sidewall in order to space said oxide collar a predetermined distance from said surface of said substrate; and filling said trench with polysilicon.

15. The method according to claim 14, further including the step of:

partially removing said node dielectric prior to said step of growing, in order to expose an underlying region of an upper portion of said sidewall where said oxide collar will be grown, and wherein said step of growing includes:

oxidizing both said node dielectric remaining on said sidewall and said exposed region of said sidewall to form said oxide collar.

16. The method according to claim 15, wherein said step of partially removing said node dielectric includes the steps of:

filling said trench with a resist material; and etching said resist a predetermined depth thereby partially removing said node dielectric and exposing said underlying region of said upper portion of said sidewall.

17. The method according to claim 16, wherein said step of etching said resist etches said underlying region of said sidewall exposed by said partial removal said node dielectric.

18. The method according to claim 17, wherein said step of etching said resist includes chemical downstream etching.

19. The method according to claim 14, further comprising the step of planarizing said substrate after said step of filling.

20. The method according to claim 14, wherein said deep trench-based DRAM comprises a 256 Mb DRAM.

* * * * *